United States Patent
Cheng et al.

(10) Patent No.: US 9,536,744 B1
(45) Date of Patent: Jan. 3, 2017

(54) ENABLING LARGE FEATURE ALIGNMENT MARKS WITH SIDEWALL IMAGE TRANSFER PATTERNING

(71) Applicant: International Business Machines Corporation, Armonk, NY (US)

(72) Inventors: Kangguo Cheng, Schenectady, NY (US); Sivananda K. Kanakasabapathy, Niskayuna, NY (US); Fee Li Lie, Albany, NY (US); Eric R. Miller, Schenectady, NY (US); Jeffrey C. Shearer, Albany, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/972,915

(22) Filed: Dec. 17, 2015

(51) Int. Cl.
| | |
|---|---|
| *H01L 29/792* | (2006.01) |
| *H01L 21/28* | (2006.01) |
| *H01L 21/3065* | (2006.01) |
| *H01L 21/308* | (2006.01) |
| *H01L 29/66* | (2006.01) |
| *H01L 29/423* | (2006.01) |

(52) U.S. Cl.
CPC ..... *H01L 21/28282* (2013.01); *H01L 21/3065* (2013.01); *H01L 21/3081* (2013.01); *H01L 29/4234* (2013.01); *H01L 29/66833* (2013.01); *H01L 29/792* (2013.01)

(58) Field of Classification Search
CPC ............ H01L 29/792; H01L 29/66833; H01L 29/4234; H01L 27/1157; H01L 21/28282; H01L 21/3065; H01L 21/3081

USPC .......................................................... 257/347
See application file for complete search history.

(56) References Cited

U.S. PATENT DOCUMENTS

| | | | |
|---|---|---|---|
| 5,795,830 A | 8/1998 | Cronin et al. | |
| 5,885,425 A | 3/1999 | Hsieh et al. | |
| 7,301,210 B2 | 11/2007 | Abadeer et al. | |
| 7,507,633 B2 | 3/2009 | Kanakasabapathy et al. | |
| 7,699,996 B2 | 4/2010 | Furukawa et al. | |
| 8,298,954 B1 * | 10/2012 | Arnold ................ H01L 21/0337 257/E21.235 |
| 8,557,675 B2 | 10/2013 | Licausi | |
| 8,673,165 B2 | 3/2014 | Raghunathan et al. | |
| 9,059,102 B2 | 6/2015 | Ausschnitt et al. | |
| 9,064,901 B1 | 6/2015 | He et al. | |
| 2010/0136791 A1 * | 6/2010 | Lai ...................... H01L 21/0337 438/703 |
| 2011/0273685 A1 | 11/2011 | Li et al. | |

(Continued)

OTHER PUBLICATIONS

Kangguo Cheng, et al.,"Enabling Large Feature Alignment Marks With Sidewall Image Transfer Patterning" U.S. Appl. No. 15/158,033, Date Filed: May 18, 2016.

(Continued)

*Primary Examiner* — Nathan W Ha
(74) *Attorney, Agent, or Firm* — Cantor Colburn LLP; Steven Meyers

(57) ABSTRACT

In an embodiment, this disclosure relates to a method of creating an alignment feature within a sidewall image transfer process by the addition of a block mask. The presence of the alignment feature would enable better overlay and alignment for subsequent lithographic stacks.

14 Claims, 6 Drawing Sheets

(56) References Cited

U.S. PATENT DOCUMENTS

| | | | | |
|---|---|---|---|---|
| 2012/0142194 A1* | 6/2012 | Hwang | ............... | H01L 21/0337 438/703 |
| 2012/0156882 A1* | 6/2012 | Lee | .................... | H01L 21/0337 438/703 |
| 2012/0156888 A1* | 6/2012 | Sato | .......................... | C23C 8/36 438/716 |
| 2012/0289051 A1* | 11/2012 | Kim | .................... | H01L 21/0337 438/702 |
| 2015/0243503 A1 | 8/2015 | Leobandung | | |

OTHER PUBLICATIONS

List of IBM or Patent Applications Treated as Related; FIS920150258US1, Date Filed: Dec. 17, 2015, pp. 1-2.

\* cited by examiner

ENABLING LARGE FEATURE ALIGNMENT MARKS WITH SIDEWALL IMAGE TRANSFER PATTERNING

BACKGROUND

The present disclosure relates to a method of enabling large feature alignment marks with sidewall image transfer patterning.

Semiconductor manufacturing utilizes the sequential patterning of process layers on a single semiconductor wafer. Lithographic exposure tools known as steppers or scanners print multiple integrated circuit patterns or fields (also known as product cells) by lithographic methods on successive layers of the wafer. These exposure tools transfer patterns of a photo mask having customized circuit patterns to thin films formed on a wafer. In doing so, different layers are patterned by applying step and repeat lithographic exposure or step and scan lithographic exposure, in which the full area of the wafer is patterned by sequential exposure of the stepper fields containing one or more integrated circuits.

The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask to accomplish the image transfer process. This image transfer process is performed several times to transfer the circuit patterns to each non-process layer to form the integrated circuit device. Typically, 20 to 50 layers are required to create an integrated circuit.

In order to match corresponding features in successive lithographic process layers on the semiconductor wafer, it is important to keep both alignment and overlay errors as small as possible and within predetermined limits. Measurements are typically performed using metrology imaging tools, such as optical, scanning e-beam or atomic force microscopy systems. In practice, alignment and overlay metrology systems often require different specialized target designs and locations on each layer.

Overlay targets can be comprised of sub-patterns from both the same and different masks. The images are analyzed to determine the relative layer-to-layer and within-layer placement of the sub-patterns among the various mask layers printed on the wafer. Overlay error is the deviation of the relative position among patterns from their designed relative positions, as determined by an overlay metrology tool. In doing so, the overlay correlation set in an exposure tool is used to insure alignment precision between the successively patterned layers. A metrology process determines precision of the overlay alignment by referring to the overlay alignment mark sets of the successive patterned layers.

To ensure circuit functionality, overlay errors must be minimized among all wafer patterns, consistent with the ground rules of the most critical circuit devices. While prior art has focused on several metrology processes for determining overlay alignment, as semiconductor device critical dimensions continue to shrink, and the speed and functionality requirements thereof continue to increase, improvements continue to be needed in minimizing alignment and overlay errors.

That is, a need exists in the art for methods, apparatus, and structures that align successively patterned layers to reduce misalignment errors as critical dimensions of semiconductor devices continue to shrink and the processing requirements thereof continue to develop.

SUMMARY

According to an embodiment of the present invention, a method of forming an alignment feature and a sidewall feature on an integrated circuit component comprises depositing a spacer material layer on the integrated circuit component comprising a gate electrode layer and a hard mask layer on the gate electrode layer; depositing a first mask layer on the spacer material layer and patterning an opening in the first mask layer; wherein the first mask layer is located on the alignment portion of the spacer material layer; removing the spacer material layer located in the opening of the first mask layer; depositing a mandrel material layer after removing the spacer material layer and polishing the mandrel material layer to form a polished mandrel material layer; depositing a second mask layer on the polished mandrel material layer and patterning a second opening in the second mask layer to expose an unprotected area of the polished mandrel material layer; removing the polished mandrel material layer located in the unprotected area to form a mandrel; depositing a sidewall spacer layer on the mandrel comprising a remaining mandrel material layer; etching the remaining mandrel material layer; and removing the alignment portion of the spacer material to form the alignment feature and forming the sidewall features in the hard mask layer.

According to another embodiment, a method of forming an alignment feature and a sidewall feature on an integrated circuit component comprises depositing a spacer material layer on the integrated circuit component comprising a gate electrode layer; a silicon nitride layer located on top of the gate electrode layer, a silicon dioxide layer located on top of the silicon nitride layer, and a hard mask planarization layer located on top of the silicon dioxide layer; depositing a first photoresist layer on the spacer material layer and patterning an opening in the first photoresist layer; wherein the first photoresist layer is located on the alignment portion of the spacer material layer; removing the spacer material layer located in the opening of the first photoresist layer; depositing a mandrel material layer after removing the spacer material layer and polishing the mandrel material layer to form a polished mandrel material layer; depositing a second photoresist layer on the polished mandrel material layer and patterning a second opening in the photoresist mask layer to expose an unprotected area of the polished mandrel material layer; removing the polished mandrel material layer located in the unprotected area to form a mandrel; depositing a sidewall spacer layer on the mandrel comprising a remaining mandrel material layer; etching the remaining mandrel material layer; and removing the alignment portion of the spacer material to form the alignment feature and forming the sidewall features in the silicon nitride layer, the silicon dioxide layer, and the hard mask planarization layer.

Yet, according to another embodiment, an integrated circuit component comprises a gate electrode layer; and a hard mask layer on the gate electrode layer; wherein the hard mask layer comprises an alignment feature and a sidewall feature.

BRIEF DESCRIPTION OF THE DRAWINGS

Refer now to the figures, which are exemplary embodiments, and wherein the like elements are numbered alike.

FIG. 1 is a perspective view of an integrated circuit component having a spacer material layer deposited thereon;

FIG. 2 is a perspective view of an integrated circuit component having a patterned mask layer formed thereon;

FIG. 3 is a perspective view of an integrated circuit component having an opening in the spacer material layer;

FIG. 4 is a perspective view of an integrated circuit component having a mandrel material layer deposited thereon;

FIG. 5 is a perspective view of an integrated circuit component having a polished mandrel material layer;

FIG. 6 is a perspective view of an integrated circuit component having a second patterned mask layer formed thereon;

FIG. 7 is a perspective view of an integrated circuit component having an unprotected portion of the mandrel material layer removed;

FIG. 8 is a perspective view of an integrated circuit component having a sidewall spacer layer deposited thereon;

FIG. 9 is a perspective view of an integrated circuit component having the remaining mandrel material layer removed;

FIG. 10 is a perspective view of an integrated circuit component having an alignment feature and formed sidewall features.

DETAILED DESCRIPTION

Structures printed using the current sidewall image transfer (SIT) patterning techniques have a critical dimension that is dictated by the thickness of a sidewall material that is deposited on top of a patterned mandrel. Therefore, for sidewall image transfer based structures that are used for mask alignment, the resulting alignment lines have the same dimension and critical dimension. The alignment lines can therefore be on the order of 10 to 20 nanometers. Unfortunately, this length scale is often too small to be seen by alignment tools, thus often hindering alignment.

The inventors hereof have developed a method of enabling the formation of an alignment feature having a significantly larger length scale than a formed sidewall feature. For example, the alignment feature can have a width on the micrometer length scale as compared to a sidewall feature that can have a width on the nanometer length scale. This method allows for a better overlay and alignment of successive patterned layers.

Figure 1:
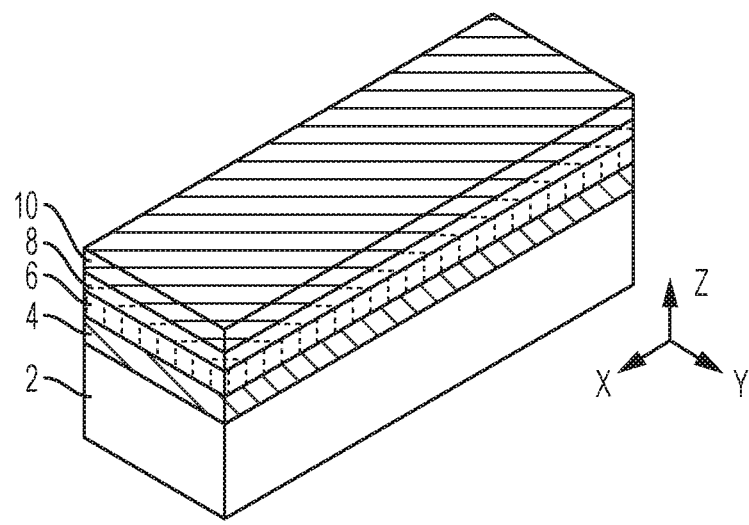
FIGS. 1-10 illustrate an embodiment of a method of preparing an integrated circuit component.

FIGS. 1-10 illustrate the fabrication of an integrated circuit component in accordance with embodiments of the present disclosure. The fabrication of the integrated circuit component can be started with the component as illustrated in FIG. 1, which can comprise gate electrode layer 2, a hard mask layer located on top of the gate electrode layer, and spacer material layer 10 located on top of the hard mask layer. The hard mask layer can comprise memory layer 4 located on top of gate electrode layer 2, oxide layer 6 located on top of memory layer 4, and hard mask planarization layer 8 located on top of oxide layer 6. Gate electrode layer 2 can be formed on a substrate, which is not shown here for simplicity. Gate electrode layer 2 can comprise a polysilicon.

The substrate can comprise Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. The substrate can comprise a semiconductor-on-insulator (SOI) substrate with buried oxide (BOX) layers. The buried oxide layer is an oxide, for example, silicon dioxide, or a nitride, for example, silicon nitride.

The substrate can have a thickness of 0.1 to 750 micrometers. The substrate can comprise bulk Si and can have a thickness of 700 to 800 micrometers. The substrate can comprise a semiconductor-on-insulator (SOI) (such as a silicon-on-insulator) and can have a thickness of 5 to 100 nanometers.

One or both of memory layer 4 and oxide layer 6 can comprise a dielectric material, for example, an oxide, an oxide precursor, or a nitride. Non-limiting examples of materials for forming memory layer 4 and oxide layer 6 include silicon dioxide, silicon nitride, tetraethylorthosilicate (TEOS) oxide, high aspect ratio plasma (HARP) oxide, high temperature oxide (HTO), high density plasma (HDP) oxide, or any combination thereof.

Memory layer 4 and oxide layer 6 can comprise the same or different material(s). For example, memory layer 4 and oxide layer 6 can comprise silicon nitride. Conversely, only memory layer 4 can comprise a silicon nitride and oxide layer 6 can comprise a material other than a silicon nitride. Oxide layer 6 can comprise silicon dioxide ($SiO_2$), tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or a combination comprising at least one of the foregoing. Oxide layer 6 can comprise silicon dioxide ($SiO_2$).

One or both of memory layer 4 and oxide layer 6 can be formed by chemical vapor deposition (CVD), physical vapor deposition (PVD), plasma enhanced CVD (PECVD), atomic layer deposition (ALD), evaporation, chemical solution deposition, and/or other like processes.

One or both of memory layer 4 and oxide layer 6 can have a thicknesses of 10 to 200 nanometers, specifically, 20 to 100 nanometers.

Spacer material layer 10 can comprise can comprise an inorganic material such as silicon dioxide, silicon nitride, and the like. Spacer material layer 10 can be formed by atomic layer deposition.

Figure 2:
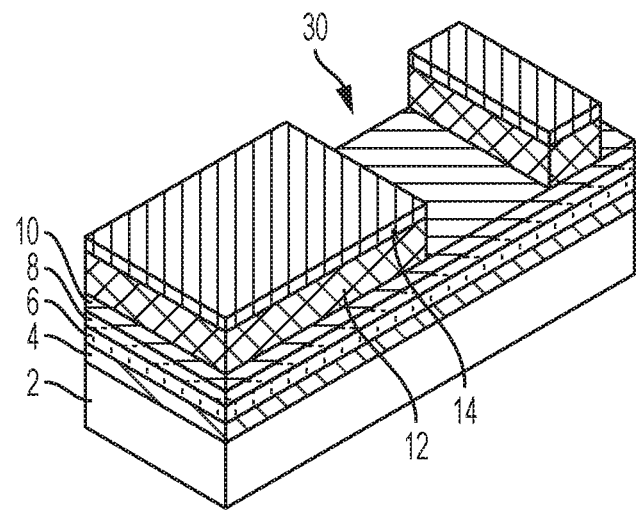
Figure 10:
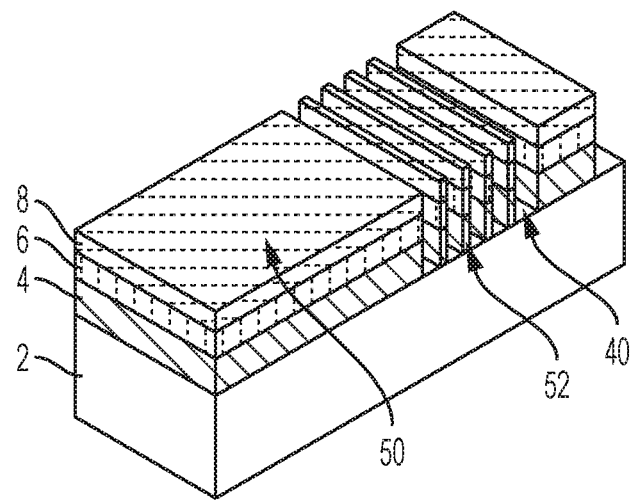

Next, with reference to FIG. 2, mask layer 14 can form a block mask on top of spacer material layer 10 such that an area, where frequency doubling is not desired, can be preserved. This area, also referred to herein as an alignment portion, corresponds to alignment feature 50 as illustrated in FIG. 10. Organic planarizing layer 12 can be located in between spacer material layer 10 and mask layer 14.

Mask layer 14 can be any suitable resist. Suitable resists include photoresists, electron-beam resists, ion-beam resists, X-ray resists, and etchant resists. The resist can comprise a polymeric material, for example, that can be applied by spin casting. The mask may be removed by, for example, an ashing process.

Mask layer 14 can be formed by spin coating a photo resist material followed by photolithography to form one or more of opening(s) 30.

Figure 3:
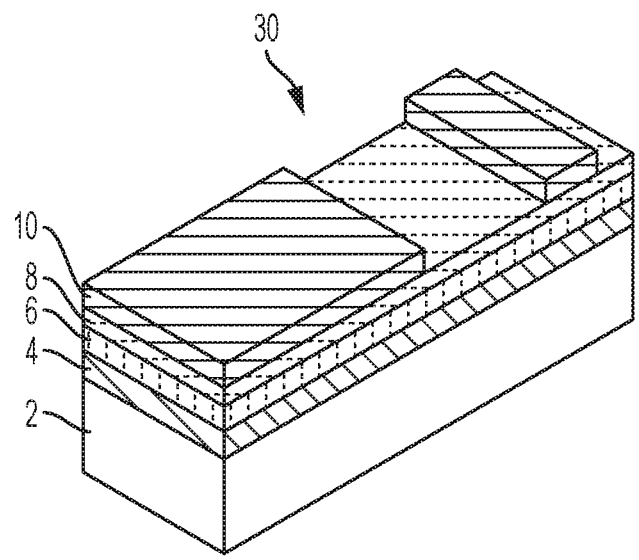

FIG. 3 illustrates that a portion of the spacer material layer 10 can be removed to form one or more of opening(s) 30 corresponding to the opening(s) in mask layer 14. Opening(s) 30 in spacer material layer 10 can be formed by a direction etching process, such as reactive ion etching (RIE), a remote plasma, diluted HF, or chemical vapor/sublimation. Non-limiting examples of suitable etching processes include silicon etching methods selective to oxides. As used herein, the reactive ion etching can comprise a simultaneous exposure to hydrogen (H$_2$), nitrogen trifluoride (NF$_3$), and ammonia (NH$_3$) plasma by-products (SiCoNi process).

Mask layer 14 can be removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a combination comprising at least one of the foregoing.

Figure 4:
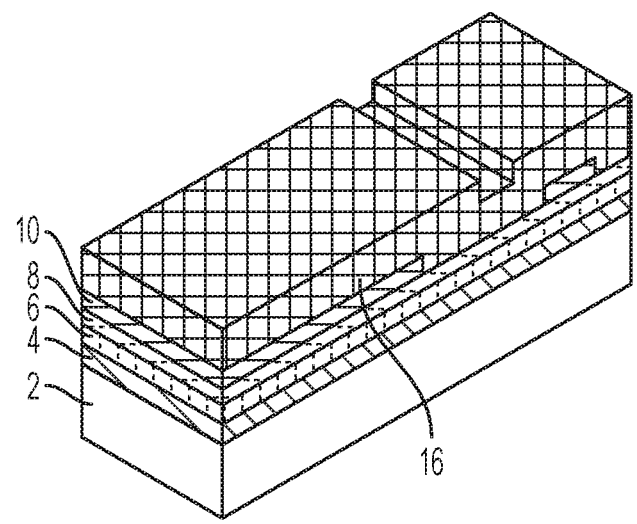
Figure 5:
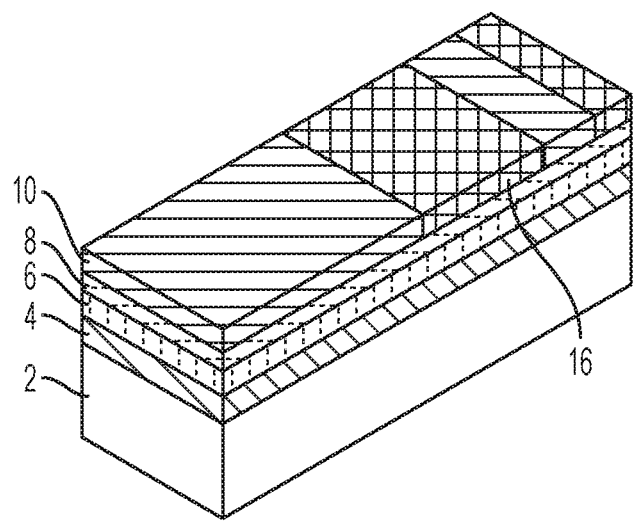

Next, with reference to FIGS. 4 and 5, mandrel material layer 16 can be deposited on the integrated circuit component (FIG. 4). Mandrel material layer 16 can be located on spacer material layer 10 and an exposed hard mask layer. Mandrel material layer 16 can comprise a polymer, for example, a random copolymer comprising repeat units derived from styrene, methylmethacrylate, or a combination comprising at least one of the foregoing. Mandrel material layer 16 can comprise an inorganic material such as silicon dioxide, silicon nitride, and the like. Mandrel material layer 16 can be formed by spin coating.

Mandrel material layer 16 can then be polished (also referred to as planarized), for example, by chemical and mechanical polishing, to remove the mandrel material that is located on top of spacer material layer 10 to form a flat surface with spacer material layer 10 as illustrated in FIG. 5. For example, mandrel material layer 16 can have the same height (on the z-axis as illustrated in FIG. 1) as spacer material layer 10.

Figure 6:
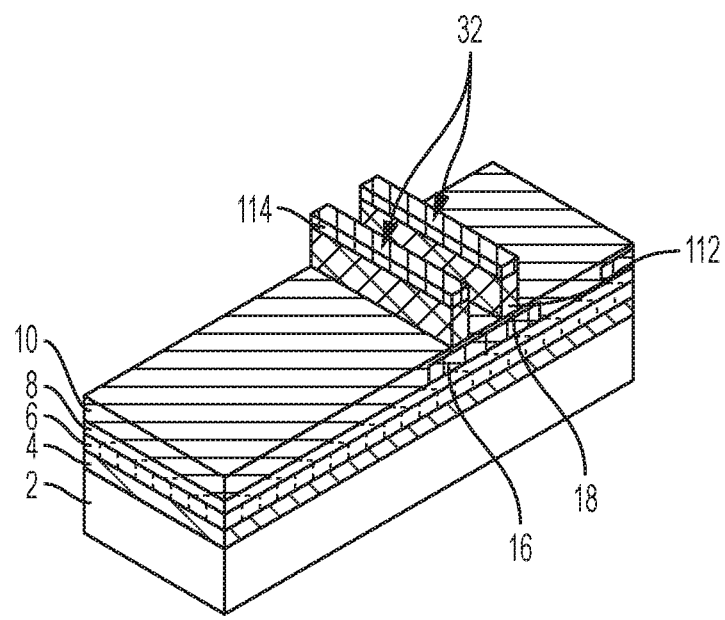

Next, with reference to FIG. 6, lithographic feature(s) 32 can be formed on top of mandrel material layer 16. Lithographic feature(s) 32 can be formed by first applying a mask material followed by forming the features. For example, the mask material can comprise a resist such as a photoresist and the features can be formed by photolithography. Adhesion layer 18 can be formed on top of mandrel material layer 16 prior to applying the mask material.

Lithographic feature(s) 32 can mask an area of mandrel material layer 16 to protect it during a subsequent etching step, where an unprotected area of mandrel material layer 16 that does not have a lithographic feature(s) 32 on top of it, can be subsequently etched.

Second mask layer 114 can be any suitable resist. Suitable resists include photoresists, electron-beam resists, ion-beam resists, X-ray resists, and etchant resists. The resist can comprise a polymeric material, for example, that can be applied by spin casting. The mask may be removed by, for example, an ashing process.

Figure 7:
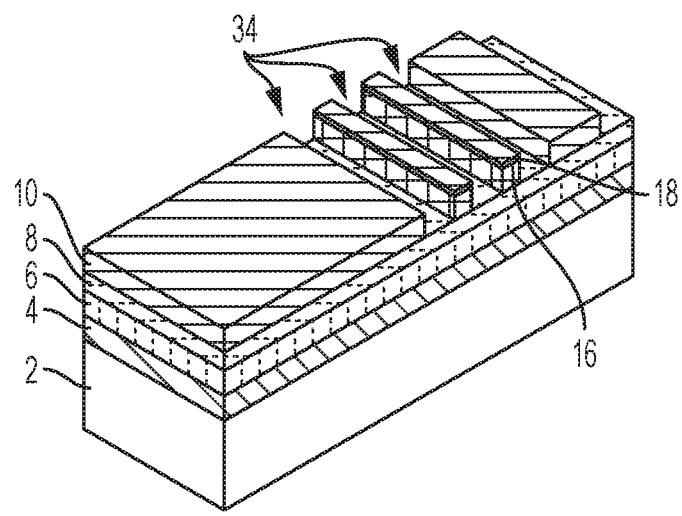

FIG. 7 illustrates that the unprotected portion of spacer material layer 10 can be removed to form one or more mandrels and one or more of mandrel opening(s) 34 corresponding to the space in mandrel material layer 16 that was not covered by second mask layer 114. Mandrel opening(s) 34 in spacer material layer 10 can be formed by a directional etching process, such as reactive ion etching, a remote plasma, diluted hydrogen fluoride, or chemical vapor/sublimation. Non-limiting examples of suitable etching processes include silicon etching methods selective to oxides.

Mandrel opening(s) 34 can have an opening width, $w_m$. For example, the opening width, $w_m$, can be greater than or equal to 5 nanometers, for example, 5 to 100 nanometers.

Mask layer 114 can be removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a combination comprising at least one of the foregoing.

Figure 8:
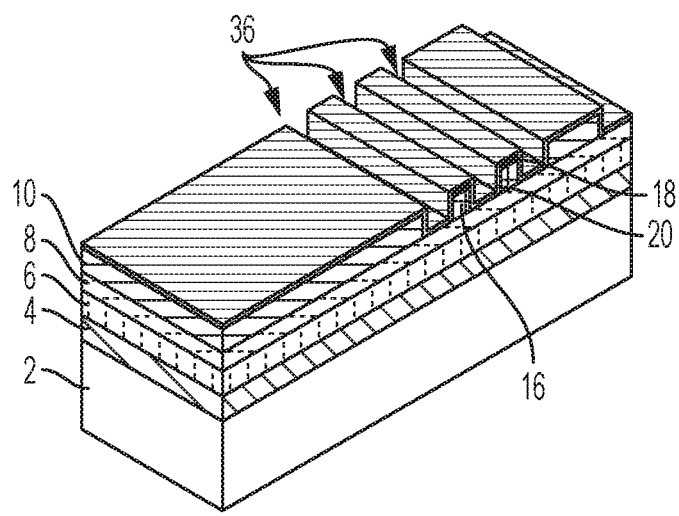

Next, with reference to FIG. 8, sidewall spacer layer 20 can be deposited onto the top surface of the integrated circuit component. Sidewall spacer layer 20 can form a layer on the sidewalls of mandrel material layer 16 to form sidewall opening(s) 36 that has a sidewall opening width, $w_s$, that is less than $w_m$. For example, the sidewall opening width can be equal to the opening width minus two times the width of the deposited sidewalls, $w_w$, ($w_s = w_m - 2w_w$). The deposited sidewalls can have a width of 5 to 100 nanometers, specifically, 10 to 100 nanometers, more specifically, 10 to 40 nanometers. As is used herein, the width refers to the length in the x-direction as is illustrated in FIG. 1.

Figure 9:
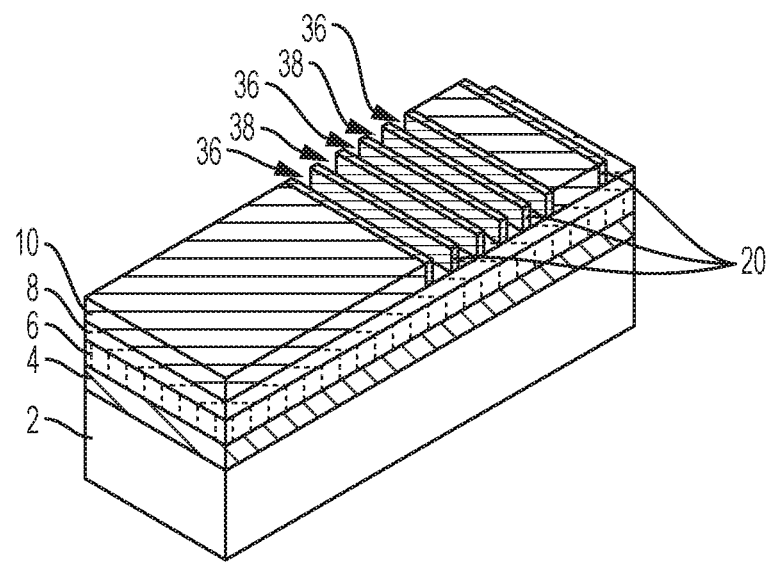

Next, with reference to FIG. 9, an anisotropic, top to bottom etching process, such as reactive ion etching, a remote plasma, diluted hydrogen fluoride (such as hydrogen fluoride diluted with ethylene glycol (HFEG)), or chemical vapor/sublimation, can be performed to expose the remaining mandrel material layer 16 by first removing the sidewall spacer layer 20 and any adhesion layer 18 located on top of mandrel material layer 16. Following the etching, the remaining mandrel material layer 16 can be removed. Etching of the sidewall spacer layer 20 and the mandrel material layer 16 can be performed in a single step, for example, if the mandrel material layer 16 comprises a carbon based material; or in multiple etching steps, for example, if the mandrel material layer 16 comprises an inorganic material such as silicon nitride. FIG. 9 illustrates that after removal of the remaining mandrel material layer, the surface comprises spacer etch opening(s) 38 located in the spaces where the mandrel material layer had been.

Finally, FIG. 10 illustrates that a hard mask open can be used to remove the remaining spacer material layer 10 forming alignment feature 50 and to form sidewall feature(s) 52 in the hard mask layer, for example, in memory layer 4, oxide layer 6, and hard mask planarization layer 8, with etched opening(s) 40 located in between sidewall feature(s) 52. The hard mask open can comprise a selective etch process such as a wet etch process. The wet etch process can comprise etching with hydrogen fluoride diluted with ethylene glycol (HFEG).

The width of sidewall feature(s) 52 can correspond to the width of the deposited sidewalls. For example, the sidewall feature(s) 52 can have a width of 5 to 100 nanometers, specifically, 10 to 100 nanometers, more specifically, 10 to 40 nanometers.

The alignment feature can have a width of greater than or equal to 25 nanometers, specifically, 25 to 100 nanometers.

Using the present method, the critical dimension (CD) of the formed integrated circuit component is the thickness of the minimum thickness of sidewall spacer layer 20 that can be deposited. As used herein, the CD refers to a smallest dimension of geometrical features (width of interconnect line, contacts, trenches, etc.), which can be practically formed without any deformation or distortion during semiconductor device/circuit manufacturing.

Figure 11:
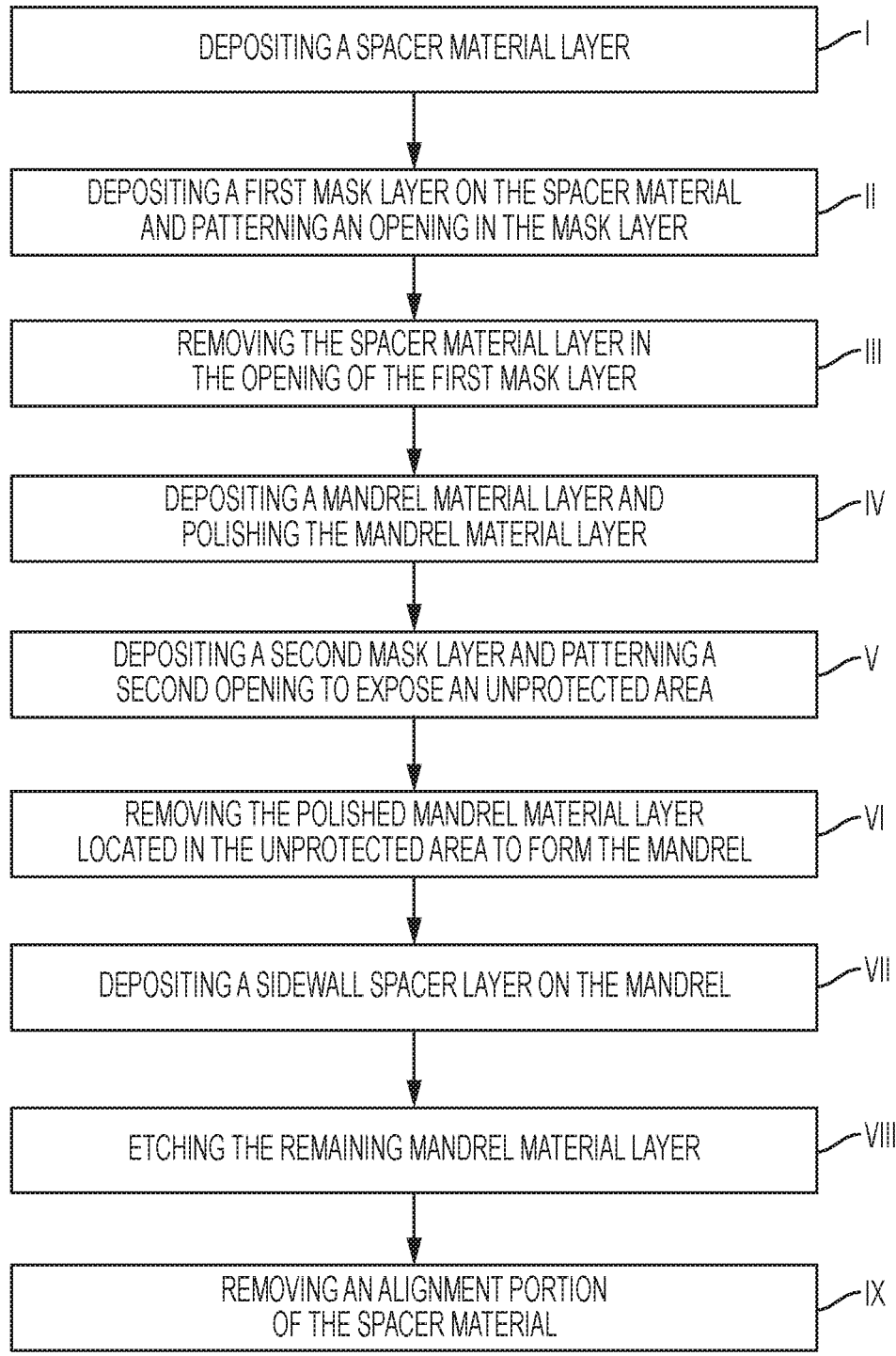
FIG. 11 is an illustration of an embodiment of a method of forming an alignment feature.

FIG. 11 is an illustration of an embodiment of a method of forming an alignment feature. Step I comprises depositing a spacer material layer on an integrated circuit component comprising a gate electrode layer and a hard mask layer on the gate electrode layer. The hard mask layer can comprise a memory layer located on top of the gate electrode layer, an oxide layer located on top of the memory layer, and a hard mask planarization layer located on top of the oxide layer.

Step II comprises depositing a first mask layer on the spacer material layer and patterning an opening in the first mask layer. The first mask layer can be located on the alignment portion of the spacer material layer. Step III comprises removing the spacer material layer located in the opening of the first mask layer. Step IV comprises depositing a mandrel material layer after removing the spacer material layer and polishing the mandrel material layer to form a polished mandrel material layer.

Step V comprises depositing a second mask layer on the polished mandrel material layer and patterning a second opening in the second mask layer to expose an unprotected area of the polished mandrel material layer. Step VI comprises removing the polished mandrel material layer located in the unprotected area to form a mandrel. The removing the polished mandrel material layer can comprise reactive ion etching. Step VII comprises depositing a sidewall spacer layer on the mandrel comprising a remaining mandrel material layer. Step VIII comprises etching the remaining mandrel material layer. Step IX comprises removing the alignment portion of the spacer material to form the alignment feature and forming the sidewall features in the hard mask layer.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular. "or" means "and/or".

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the disclosure and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of this disclosure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an alignment feature and a sidewall feature on an integrated circuit component, the method comprising:
    depositing a spacer material layer on the integrated circuit component comprising a gate electrode layer and a hard mask layer on the gate electrode layer;
    depositing a first mask layer on the spacer material layer and patterning an opening in the first mask layer; wherein the first mask layer is located on an alignment portion of the spacer material layer;
    removing the spacer material layer located in the opening of the first mask layer;
    depositing a mandrel material layer after removing the spacer material layer located in the opening of the first mask layer and polishing the mandrel material layer to form a polished mandrel material layer;
    depositing a second mask layer on the polished mandrel material layer and patterning a second opening in the second mask layer to expose an unprotected area of the polished mandrel material layer;
    removing the polished mandrel material layer located in the unprotected area to form a mandrel;
    depositing a sidewall spacer layer on the mandrel comprising a remaining mandrel material layer;
    etching the remaining mandrel material layer;
    removing portions of the hard mask layer selective to the spacer material layer and the gate electrode layer to form the alignment feature and the sidewall feature in the hard mask layer; and
    removing the alignment portion of the spacer material layer to expose the alignment feature and the sidewall feature.

2. The method of claim 1, wherein the hard layer mask comprises
    a memory layer located on top of the gate electrode layer, an oxide layer located on top of the memory layer, and a hard mask planarization layer located on top of the oxide layer.

3. The method of claim 2, wherein the memory layer comprises a silicon nitride.

4. The method of claim 1, wherein the oxide layer comprises silicon dioxide.

5. The method of claim 1, wherein the gate electrode layer comprises a polysilicon.

6. The method of claim 1, wherein the removing the polished mandrel material layer comprises reactive ion etching.

7. The method of claim 1, further comprising forming an adhesion layer prior to depositing the second mask layer.

8. The method of claim 1, wherein the removing the spacer material layer comprises reactive ion etching.

9. The method of claim 1, wherein one or both of the first mask layer and the second mask layer comprises an organic planarizing layer.

10. The method of claim 1, wherein one or both of the patterning the opening and the patterning the second opening comprises photolithographically patterning.

11. The method of claim 1, wherein the etching the remaining mandrel material layer comprises reactive ion etching.

12. A method of forming an alignment feature and a sidewall feature on an integrated circuit component, the method comprising:
    depositing a spacer material layer on the integrated circuit component comprising a gate electrode layer; a silicon nitride layer located on top of the gate electrode layer, a silicon dioxide layer located on top of the silicon nitride layer, and a hard mask planarization layer located on top of the silicon dioxide layer;
    depositing a first photoresist layer on the spacer material layer and patterning an opening in the first photoresist layer; wherein the first photoresist layer is located on an alignment portion of the spacer material layer;
    removing the spacer material layer located in the opening of the first photoresist layer;
    depositing a mandrel material layer after removing the spacer material layer located in the opening of the first photoresist layer and polishing the mandrel material layer to form a polished mandrel material layer;
    depositing a second photoresist layer on the polished mandrel material layer and patterning a second opening in the photoresist mask layer to expose an unprotected area of the polished mandrel material layer;
    removing the polished mandrel material layer located in the unprotected area to form a mandrel;
    depositing a sidewall spacer layer on the mandrel comprising a remaining mandrel material layer;
    etching the remaining mandrel material layer;
    removing portions of the silicon nitride layer, portions of the silicon dioxide layer, and portions of the hard mask planarization layer selective to the spacer material layer and the gate electrode layer to form the alignment feature and the sidewall feature in the silicon nitride layer, the silicon dioxide layer, and the hard mask planarization layer; and
    removing the alignment portion of the spacer material layer to expose the alignment feature and the sidewall feature.

13. The method of claim 12, wherein the gate electrode layer comprises a polysilicon.

14. The method of claim 12, wherein the removing the polished mandrel material layer comprises reactive ion etching.

* * * * *